United States Patent [19]
Nakasuji

[11] Patent Number: 6,078,382
[45] Date of Patent: Jun. 20, 2000

[54] CHARGED-PARTICLE-BEAM PROJECTION-OPTICAL SYSTEM

[75] Inventor: Mamoru Nakasuji, Yokohama, Japan

[73] Assignee: Nikon Corporation, Tokyo, Japan

[21] Appl. No.: 09/067,313

[22] Filed: Apr. 27, 1998

[30] Foreign Application Priority Data

Apr. 30, 1997 [JP] Japan ..................................... 9-124722

[51] Int. Cl.$^7$ .................................................. G03B 27/52
[52] U.S. Cl. .............. 355/55; 250/396 R; 250/396 ML; 250/492.2; 250/492.22
[58] Field of Search .................... 355/20, 55; 250/492.2, 250/492.22, 396 R, 396 ML

[56] References Cited

U.S. PATENT DOCUMENTS

| | | | |
|---|---|---|---|
| 5,099,130 | 3/1992 | Aitken ...................................... | 250/396 |
| 5,175,435 | 12/1992 | Sakamoto et al. .................... | 250/492.2 |
| 5,276,334 | 1/1994 | Yamada et al. ....................... | 250/492.2 |
| 5,466,904 | 11/1995 | Pfeiffer et al. ........................ | 250/492.2 |

OTHER PUBLICATIONS

Heritage, "Electron–Projection Microfabrication System," *J. Vac. Sci. Technol.* 12:1135–1140 (1975).

Primary Examiner—Howard B. Blankenship
Assistant Examiner—Emily C. Jones
Attorney, Agent, or Firm—Klarquist Sparkman Campbell Leigh & Whinston, LLP

[57] ABSTRACT

Charged-particle-beam projection optical systems are disclosed including a symmetric magnetic doublet comprising first and second magnetic lenses arranged along a system axis between a reticle position and a sample position. The lenses have point symmetry about a crossover point and a centrally located mutual focal point located between the two lenses. The dimensions on the sample-side of the cross-over point are reduced, in both the axial direction measured from the axis and the radial direction measured from the crossover point, by a demagnification ratio. The magnetic fields of each lens are opposite, the electrical excitation current applied to each lens coil is equal, and the lenses are preferably energized by the same power supply. A first beam deflector is located near the reticle inside the first lens; a second and third beam deflector are located inside the first lens and the second lens, respectively; and a fourth beam deflector is located near the sample inside the second lens. When an off-axis position on the reticle is projected, the beam deflectors deflect the beam so that the principal ray of the beam travels along the system axis between the second and third def lectors. Axis deflectors deflect the optical axis of the lenses to coincide with the path of the principal ray.

22 Claims, 2 Drawing Sheets

CHARGED-PARTICLE-BEAM PROJECTION-OPTICAL SYSTEM

FIELD OF THE INVENTION

The present invention relates to image-projection systems that use an electron beam or other charged-particle beam to transfer a pattern from a reticle or mask onto a sample such as a semiconductor wafer or other substrate. In particular, it relates to image-projection systems employing a charged-particle beam to form very high-density, fine patterns, such as those required for 4-Gigabit DRAMs and the like, with high throughput.

BACKGROUND OF THE INVENTION

A demagnifying electron-beam projection system may be used as a lithographic device for exposing integrated circuit patterns onto semiconductor wafers. In such systems, an electron beam irradiates a mask defining a desired pattern. To better control aberrations, this type of system does not simultaneously illuminate the entire mask (or even an entire die) for exposure; consequently, the pattern on the mask is divided into many tiny regions termed "mask subfields." The electron beam illuminates the mask subfields individually and sequentially. A reduced image of each illuminated subfield of the mask is formed via a two-stage projection lens on corresponding "transfer subfields" on a sensitized wafer or other substrate. (For an example of such a system, see Japanese Patent Publication No. Hei 5-160012, incorporated herein by reference. For a discussion of applications of this technique, see, for example, U.S. Pat. Nos. 5,260,151 and 5,466,904, incorporated herein by reference).

Typical lens systems and techniques used in demagnifying electron-beam projection lithography systems include: (1) MOL (Moving Objective Lens) and VAL (Variable Axis Lens) systems, in which magnetic fields formed by axis deflectors are applied to the magnetic field of the lens so as to shift the electron-optical axis of the lens, and the symmetric magnetic doublet lens system, which represents an attempt to suitably minimize certain aberrations in the electron-optical system.

With the symmetric magnetic doublet, all anisotropic (rotational) aberrations, chromatic magnification aberrations, and distortion are zero. (See, for example, M. B. Heritage, "Electron-Projection Microfabrication System," *J. Vac. Sci. Technol.*, Vol. 12, No. 6, November. December. 1975, incorporated herein by reference). In the symmetric magnetic doublet lens system, however, field curvature cannot be completely corrected. Consequently, at large aperture angles, the aberrations become so large that the lens system is no longer useful for high-resolution imaging. At small aperture angles, on the other hand, electron—electron interaction in the beam (the so-called Coulomb interaction) defocuses the beam substantially such that high-current, high-throughput image transfer is impossible.

Conventional MOL and VAL lenses, (as shown, for example, in U.S. Pat. No. 5,466,904,) exhibit problems with astigmatism and field curvature when projecting an off-axis mask subfield. Also, substantial aberrations are caused by the beam deflectors when projecting off-axis subfields.

OBJECTS AND SUMMARY OF THE INVENTION

One object of the present invention is to provide a charged-particle-beam projection-optical system exhibiting low aberrations and little beam defocusing, even at large aperture angles, and with little distortion. This is accomplished in the present invention by providing a symmetric-magnetic-doublet projection system that can be disposed between a reticle and a sample. The projection system comprises first and second magnetic lenses, arranged along a system axis, and at least four beam deflectors. A first beam deflector is located near the reticle, a second beam deflector is positioned inside the first lens, a third beam deflector is positioned inside the second lens, and a fourth beam deflector is located near the sample.

The reticle is illuminated by, e.g., an electron beam (as a representative charged-particle beam) scanned or stepped across the reticle using any of various methods known in the art. During such stepping or scanning, the beam at times illuminates a portion of the reticle not positioned directly on the system axis.

According to an aspect of the present invention, when such an off-axis location of the reticle is illuminated and projected to the sample, the beam deflectors are operated so as to deflect the patterned beam traveling from the reticle to the sample.

The first beam deflector deflects the principal ray of the patterned beam to intersect the system axis at the second beam deflector. The second beam deflector deflects the principal ray from the first beam deflector toward the sample along the system axis. The third beam deflector deflects the principal ray from the second beam deflector away from the system axis so as to intersect, at the fourth beam deflector, a line extending upward parallel to the system axis from the desired imaging location on the sample. The fourth beam deflector deflects the principal ray from the third beam deflector toward the sample axis along the above-described line. Thus, even when the illuminated portion of the reticle is located off-axis, the illuminating beam travels on the system axis for a substantial distance, allowing reduced aberrations and improved imaging performance.

In a "symmetric magnetic doublet lens system" as used in the present invention, the two lenses of the doublet have point symmetry about a cross-over point (a centrally located, mutual focal point for each of the two lens elements of the doublet), but with the dimensions on the sample-side of the cross-over point being reduced (in both the axial direction measured from the axis and the radial direction measured from the crossover point) by the demagnification ratio. Further, the magnetic fields of each lens are of opposite orientation, and the ampere-turn (AT) value of each lens coil is equal. Use of such a symmetric magnetic doublet configuration cancels out anisotropic (rotational) aberrations, chromatic magnification aberrations, and distortion. The two lenses are also preferably supplied with power from the same power supply, such that possible effects of power fluctuations are substantially canceled.

The system of the present invention also includes axis deflectors each producing a magnetic field that laterally shifts the optical axis of the respective projection lens. When a patterned electron beam is projected from the reticle to the sample, the axis deflectors are operated so as to make the optical axis of the respective projection lenses coincident with the trajectory of the principal ray of the patterned electron beam. The radial component of the field to be produced by the axis deflectors may be expressed as follows:

$$\vec{Y}(z, \vec{r}) = (\tfrac{1}{2})\vec{R}(z)dB(z)/dz \tag{1}$$

where $z$ is the axial coordinate, $\vec{r}$ is the radial coordinate, $\vec{Y}(z, \vec{r})$ is the field component perpendicular to the lens axis at the point $(z, \vec{r})$, $\vec{R}(z)$ is the position of the path of the principal ray at axial position z, and dB(z)/dz is the first-order derivative of the unmodified magnetic field distribution on the lens axis at an axial position z.

The first beam deflector is preferably positioned adjacent the reticle inside the first projection lens, and the fourth beam deflector is preferably positioned adjacent the sample inside the second projection lens. The axis deflectors preferably also are positioned inside the lenses. This permits the use of lenses each having a large lens gap (the distance between the upper and lower magnetic poles of the lens), while still minimizing overall column length, resulting in significantly reduced aberrations while still minimizing electron interaction in the beam. The positions of the beam deflectors also permit a reasonably low maximum deflection angle, resulting in lower deflector-induced aberrations.

The beam deflectors preferably are arranged and positioned to have point symmetry about the crossover point, with the first beam deflector corresponding to the fourth beam deflector and the second beam deflector corresponding to the third beam deflector, but with dimensions on the sample side of the crossover point (i.e., the dimensions of the third and fourth beam deflectors) being reduced by a demagnification factor M. This arrangement provides reduced aberrations attributable to the beam deflectors. Also, the first and fourth beam deflectors are preferably powered by a single respective power supply, and the second and third beam deflectors are likewise preferably powered by a single respective power supply, so that beam variations that could otherwise arise due to power fluctuations are reduced.

Symmetry of position and power supply is also preferably employed for the axis deflectors to minimize effects of power-supply variation in the axis-deflector power supplies.

The foregoing and other objects, features, and advantages of the invention will become more apparent from the following detailed description of example embodiments which proceeds with reference to the accompanying drawing.

DETAILED DESCRIPTION

A charged-particle-beam projection system according to the present invention typically utilizes a reticle on which the pattern is divided into multiple main fields, (each main field corresponding to an individual circuit or a complete die, for example). Each main field is typically divided into a plurality of mask subfields. The reticle is irradiated by a charged-particle beam in a step-and-repeat or scanning manner, using each mask subfield as an individual exposure unit, while simultaneously varying the optical parameters of the projection system. The charged-particle beam radiation, patterned by passing through the illuminated mask subfield, is focused on a sample.

Figure 1:
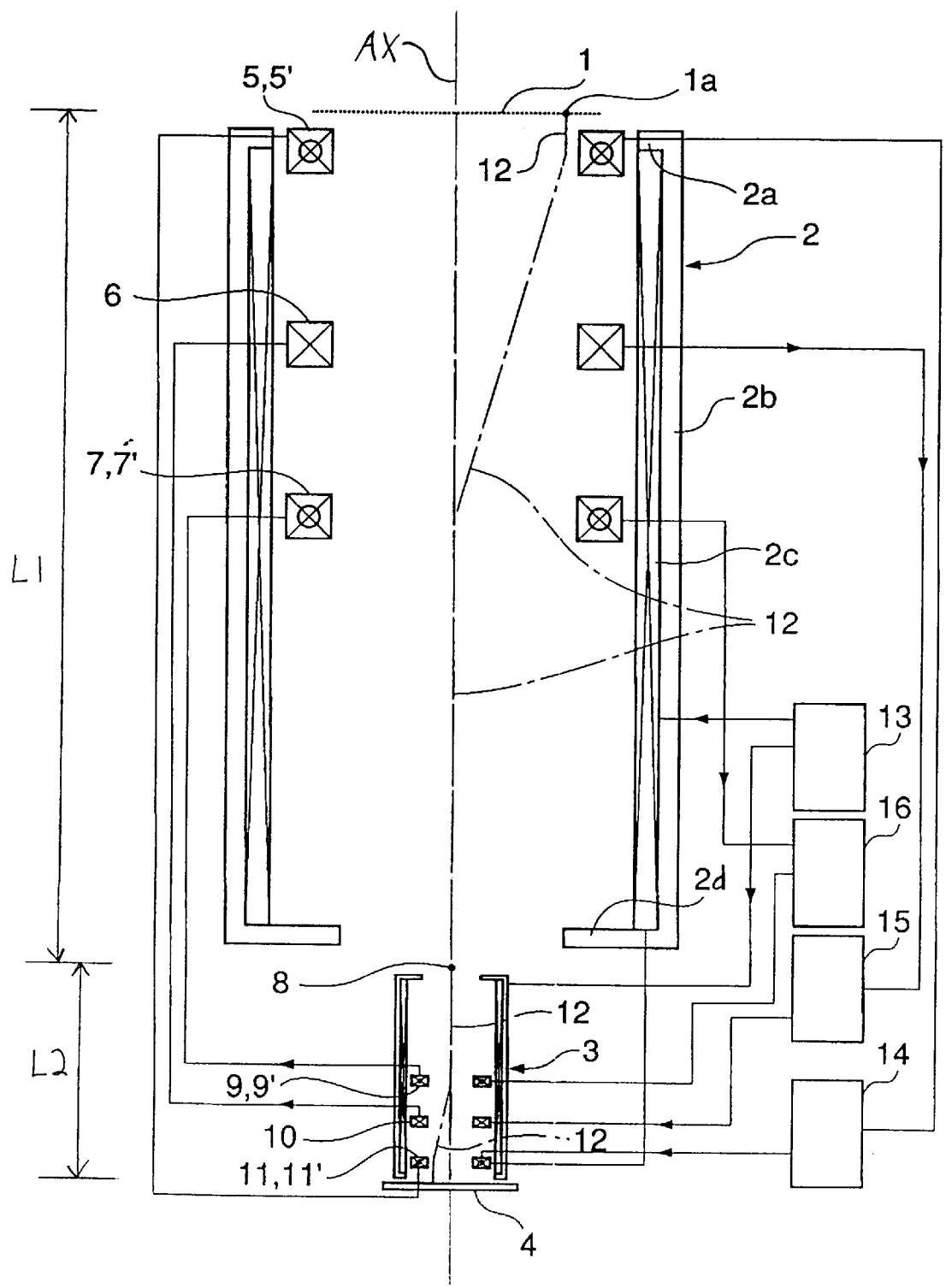
FIG. 1 is a schematic elevational depiction of an electron-beam projection system according to a preferred embodiment of the present invention.

FIG. 1 is a schematic elevation showing a preferred embodiment of a projection-optical system according to the present invention. A reticle 1 is illuminated by an electron beam (as a representative charged-particle beam) from an upstream illumination system (not shown). Downstream of the reticle 1, in sequence along a system axis AX, are positioned a first projection lens 2 and a second projection lens 3. A sample 4 is positioned downstream of the second projection lens 3. The first projection lens 2 is positioned adjacent the reticle 1, and the second projection lens 3 is positioned adjacent the sample 4. An image of a subfield on the reticle 1 is projected onto a corresponding transfer subfield on the sample 4 at a demagnification ratio M.

The system further comprises groups of axis deflectors 5, 6, 7, and 9, 10, 11, that individually produce respective magnetic fields. The magnetic fields produced by each group acts with the magnetic field produced by the first and second projection lenses 2 and 3, respectively, to laterally shift the respective lens optical axis from the system axis AX.

An electron beam for illuminating subfields on the reticle 1 is supplied by the illumination system (not shown, but understood to be upstream of the reticle 1), which includes an electron source such as an electron gun (not shown). An image of the electron source (such as an image of the crossover of the electron gun) is formed at a crossover point 8. A crossover aperture CA defined by a suitable aperture stop AS is positioned at the crossover point 8. The crossover point 8 divides the distance between the reticle position and the sample position into respective lengths L1 and L2, where L2/L1 is equal to the demagnification ratio M.

The first projection lens 2 includes a coil 2c around the inner circumference of a magnetic polepiece 2b. The polepiece 2b is rotationally symmetrical with an inward-facing C-shaped cross-section. An upper magnetic pole 2a and a lower magnetic pole 2d of the polepiece 2b protrude toward the system axis AX. A magnetic field is formed between the upper and lower poles 2a, 2d and extends therebetween generally parallel to the system axis AX. Along a path from the reticle 1 toward the sample 4, the intensity of the magnetic field formed by the first projection lens 2 increases in the vicinity of the upper magnetic pole 2a, is essentially constant inside the lens 2, and decreases in the vicinity of the lower magnetic pole 2d.

The axis deflector 5 is positioned inside (radially inward toward the system axis) the upper magnetic pole 2a of the first projection lens 2. The axis deflectors 6, 7 are positioned inside (radially inward toward the system axis) the first projection lens 2 downstream of the axis deflector 5. The axis deflector 7 is preferably centered in the direction along the system axis AX inside the first projection lens 2. The axis deflectors 5, 6, 7 are employed so as to form a magnetic field with a radial component $\vec{Y}(z, \vec{r})$ as given above in equation (1).

First and second beam deflectors 5', 7', respectively, for electron-beam deflection are positioned orthogonal to and superimposed on the same positions as the axis deflectors 5, 7, respectively.

The first and second projection lenses 2, 3, respectively, collectively form a symmetric magnetic doublet. Thus, the second projection lens 3 is a point-for-point analog of the first projection lens 2, having point symmetry with the first projection lens 2 about the crossover point 8; however, the dimensions of the second projection lens 3 are reduced by the demagnification ratio M in both the axial direction (measured from the crossover point) and in the radial direction (measured from the system axis). Also, the magnetic polarity of the second projection lens 3 is opposite the magnetic polarity of the first projection lens 2. The ampere-turn (AT) value of the second projection lens 3 is equal to the AT value of the first projection lens 2.

The axis deflectors 9, 10, 11 are positioned inside the second projection lens 3 and are point-for-point analogs of the axis deflectors 7, 6, 5, respectively. The axis deflectors 9, 10, 11 have point symmetry with the axis deflectors 7, 6, 5 about the crossover point 8, but the dimensions of the axis deflectors 9, 10, 11 are reduced in both the axial and radial directions, relative to the axis deflectors 7, 6, 5, by the demagnification ratio M.

Third and fourth beam deflectors 9' and 11' are positioned orthogonal to and superimposed on the positions of the axis deflectors 9 and 11, respectively.

A principal ray 12 passing through a representative off-axis point 1a within a given subfield on the reticle 1 is deflected by the first beam deflector 5' and intersects the system axis AX at the center of the second beam deflector 7', where the principal ray 12 is deflected by the second beam deflector 7'. The principal ray 12 then propagates along the system axis AX and, after passing through the crossover point 8, is deflected by the third beam deflector 9' so as to intersect, at the center of the fourth beam deflector 11', a line (not shown) extending upward parallel to the system axis AX from a desired image point in a corresponding transfer subfield on the sample 4. The principal ray 12 is deflected by the fourth beam deflector 11' to propagate to the sample 4 along the path of the above-mentioned line.

Thus, a principal ray from an off-axis location on the reticle is deflected such that the ray propagates along the system optical axis (i.e., along the geometric axis of both projection lenses 2, 3) for a substantial distance, resulting in a reduction in field curvature, astigmatism, coma, etc., even when off-axis subfields on the reticle are projected.

By placing the beam deflectors 5', 11' in FIG. 1 adjacent the reticle and sample, respectively, and by placing the beam deflectors 7', 9' at the respective centers of the propagation lenses 2, 3, the deflection angle that must be produced by the beam deflectors is relatively small. This reduces any distortion caused by the beam deflectors.

Current is provided to the axis deflectors 5, 6, 7 so that the axis of the first projection lens 2 coincides with the path of the principal ray 12, i.e, so that the lens optical axis of the first projection lens 2 deviates from the system axis AX of the system as a whole, so as to be centered on the path of the principal ray. The axis deflectors generate a magnetic deflection field $\vec{Y}(z, \vec{r})$ as expressed by equation (1) above, in order to make the electron-optical lens axis of the respective projection lens move to the position $\vec{R}(z)$ corresponding to the path of the principal ray.

The first projection lens 2 and the second projection lens 3 satisfy symmetric magnetic doublet conditions for bore diameter, lens gap, and excitation current. As a result, distortion, magnification and rotational chromatic aberrations, etc., are cancelled.

The geometric shape and placement of the first and second beam deflectors 5', 7', respectively, on the reticle side of the crossover point 8, and the geometric shape and placement of the beam deflectors 11', 9' on the sample side of the crossover point 8 are point-symmetric about the crossover point 8, but with dimensions in the space from the crossover point 8 to the sample 4 being reduced (in both the axial and radial directions) by the demagnification ratio. The path of the principal ray 12 from the reticle to the crossover point 8 and the path of the principal ray 12 from the crossover point 8 to the sample likewise have point symmetry about the crossover point, but with distances in the space from the crossover point 8 to the sample 4 being reduced by the demagnification ratio.

By providing deflectors and a principal-ray path having point symmetry about the crossover point 8, but reduced by the demagnification ratio, aberrations caused by intrinsic imperfections not related to deflector manufacture (aberrations caused by the edge effect, for example) are mutually cancelled, and low-aberration performance is achieved.

The first projection lens 2 and the second projection lens 3 are each preferably electromagnetic lenses comprising coils and magnetic poles that are rotationally symmetrical about the system axis Ax. Only in the vicinity of the crossover-side pole of the first projection lens 2 is the magnetic field of the first projection lens 2 substantially affected by the magnetic field of the second projection lens 3. This disturbance of the field of the first projection lens 2 by the field of the second projection lens 3 is reduced by making the bore diameters of the crossover-side pole of each lens smaller. The bore diameter of the crossover-side magnetic pole of each respective lens is preferably ⅔ or less of the bore diameter of the opposite magnetic pole of each respective lens. Thus the disturbance of the magnetic field of the first projection lens 2 by the magnetic field of the second projection lens 3 is reduced.

The first and fourth beam deflectors 5', 11', respectively, are preferably controlled by the same power supply (i.e., power supply 14), and the second and third beam deflectors 7', 9', respectively, are preferably controlled by the same power supply (i.e., power supply 16). Similarly, the axis deflectors 6, 10 for laterally shifting the lens axis are preferably controlled by the same power supply 15, and the magnetic coils of the projection lenses 2, 3 are preferably controlled by the same power supply 13. The effects of power-supply fluctuations are thus mutually cancelled, thereby improving imaging performance.

Figure 2:
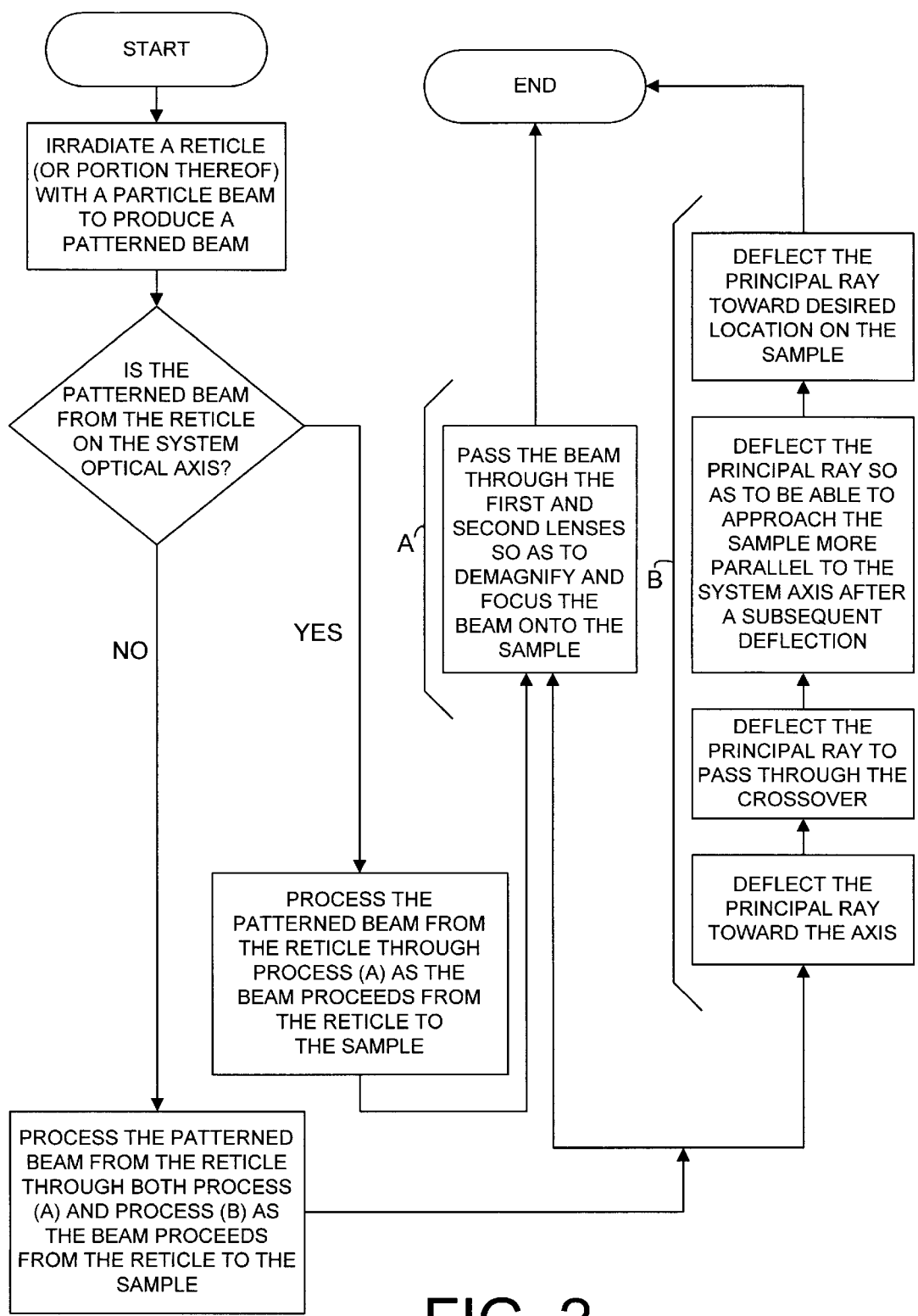
FIG. 2 is a flow diagram of the process performed by the system of the present invention.

The flowchart of FIG. 2 shows the generic steps in the processing of the patterned particle beam as it passes through the projection system of FIG. 1. A charged-particle beam is irradiated onto the reticle 1 of FIG. 1 and patterned thereby. The patterned beam is then passed through projection lenses 2 and 3 to demagnify and focus the beam onto the sample 4. If the principal ray of the patterned beam from the reticle 1 is not on the system optical axis, as shown by principal ray 12 in FIG. 1, then the principal ray of the beam is also deflected toward the system axis by the first beam deflector 5', then deflected so as to pass through the crossover point by the second beam deflector 7', then deflected by the third beam deflector 9' away from the system axis, such that the principal ray of the beam can approach a desired loction on the sample 4 in a direction more parallel to the system axis AX after subsequent deflection, then deflected by the fourth beam deflector 11' toward the desired location on the sample 4.

Having illustrated and demonstrated the principles of this invention, it should be apparent to those skilled in the art that the embodiments of the invention can be modified in arrangement and detail without departing from such principles. For example, although the invention is described above with respect to an electron-beam system, the invention is also applicable in any charged-particle-beam optical projection system, as would be apparent to persons of ordinary skill in the art. I therefore claim as the invention all that comes within the spirit and scope of the following claims.

What is claimed is:

1. A charged-particle-beam projection system, arranged along a system axis, for projecting with a demagnification ratio M a pattern from a reticle at a reticle position to a sample at a sample position, the system comprising:

(a) a first projection lens positioned along the system axis below the reticle position and having a first lens optical axis substantially coincident with the system axis;

(b) a second projection lens positioned along the system axis above the sample position and having a second lens optical axis substantially coincident with the system axis;

(c) a respective axis deflector for each of the first and second lenses for varying the first and second lens optical axes, respectively, to deviate from the system axis; and (d) a beam deflector group positioned for magnetically deflecting an electron beam during the beam's passage from the reticle to the sample, the beam deflector group comprising (i) a first beam deflector positioned below the reticle for deflecting toward the system axis a principal ray of an electron beam traveling from the reticle along a path not on the system axis, (ii) a second beam deflector positioned inside the first projection lens for deflecting, along a path coincident with the system axis, the principal ray deflected by the first beam deflector so as to cause the principal ray to cross the system axis at a crossover located on the system axis, (iii) a third beam deflector positioned inside the second projection lens for deflecting, in a direction away from the system optical axis, the principal ray deflected by the second beam deflector, and (iv) a fourth beam deflector placed above the sample for deflecting, toward a desired location on the sample, the principal ray deflected by the third beam deflector, wherein the first and second lenses are positioned on opposite sides of the crossover, the crossover dividing a distance along the system axis between the reticle position and the sample position into two lengths L1 and L2, respectively, such that M=L2/L1.

2. The projection system of claim 1, wherein each of the axis deflectors generates a deflection magnetic field having a component perpendicular to the system axis expressed by the following equation in order to modify the magnetic field of the respective lens so as to shift the respective lens optical axis to the position R(z):

$$\vec{Y}(z, \vec{r}) = (\tfrac{1}{2})\vec{R}(z)dB(z)/dz$$

where z is the axial coordinate, $\vec{r}$ is the radial coordinate, $\vec{Y}(z, \vec{r})$ is the field component perpendicular to the system axis at the point $(z, \vec{r})$, $\vec{R}(z)$ is the radial position of the path of the principal ray at axial position z, and dB(z)/dz is the first-order derivative of the unmodified magnetic field distribution on the lens axis at axial position z.

3. The projection system of claim 1, wherein the first beam deflector is positioned adjacent the reticle inside the first projection lens, and the fourth beam deflector is positioned adjacent the sample inside the second projection lens.

4. A charge-particle-beam projection optical system, having a system optical axis, for projecting with a demagnification ratio M an image of a reticle at a reticle position to a sample at a sample position, comprising:

a first lens, between a beam crossover point and the reticle position, having a first lens optical axis, the crossover point dividing a distance along the system optical axis between the reticle position and the sample position into lengths L1 and L2, respectively, such that M=L2/L1;

a second lens, between the crossover point and the sample position, having a second lens optical axis substantially aligned with the first lens optical axis;

at least two first deflectors between the reticle position and the crossover point; and at least two second deflectors between the crossover point and the sample position, at least one of the first deflectors being connected to one of the second deflectors in series to a common current source.

5. The projection system of claim 1, wherein the axis deflectors are positioned inside the first and second projection lenses.

6. The projection system of claim 1, wherein the second projection lens is arranged and structured to have point symmetry about the crossover point with the first projection lens, but with the second projection lens reduced by the demagnification ratio M in an axial dimension measured from the crossover point.

7. The projection system of claim 6, wherein the first and second projection lenses each comprise coils, each coil being structured and connected to a current source such that an electrical excitation current applied by the current source to the first and second projection lenses is equal for both projection lenses, while the magnetic polarities of the first and second projection lenses are opposite.

8. A charged-particle beam projection optical system, having a system optical axis, for projecting with a demagnification ratio M an image of a reticle at a reticle position to a sample at a sample position comprising:

a first lens, between a beam crossover point and the reticle position, having a first lens optical axis and comprising at least a first coil, the crossover point dividing a distance along the system optical axis between the reticle position and the sample position into lengths L1 and L2, respectively, such that M=L2/L1;

a second lens, between the crossover point and the sample position, having a second lens optical axis substantially aligned with the first lens optical axis and comprising at least a second coil;

at least two deflectors between the reticle position and the crossover point; and at least two deflectors between the crossover point and the sample position, wherein the first and second coils are connected in series to a common current source.

9. The projection system of claim 1, wherein the first, second, third, and fourth beam deflectors are positioned and structured such that the first and second beam deflectors have point symmetry, about the crossover point, with the fourth and third beam deflectors, respectively, but with the fourth and third beam deflectors being reduced by the demagnification ratio M in the axial dimension measured from the crossover point.

10. The projection system of claim 1, wherein the path of the principal ray from the reticle to the sample has approximate point symmetry about the crossover point, but with the dimensions of the portion of the path between the crossover point and the sample being reduced in both the axial and radial directions by the demagnification ratio M.

11. The projection system of claim 1, wherein the first and second projection lenses are electromagnetic lenses each comprising:

a coil rotationally symmetrical around the system axis, and a crossover-side magnetic pole and an opposite-side magnetic pole, each magnetic pole being rotationally symmetrical around the system axis and each having a bore diameter, the bore diameter of the crossover-side magnetic pole being ⅔ or less of the bore diameter of the opposite-side magnetic pole.

12. The projection system of claim 4, further comprising a power supply connected to both one of the first deflectors being closest to the reticle position and one of the second deflectors being closest to the sample position so as to control both of said thus-connected deflectors.

13. The projection system of claim 4, further comprising a power supply connected to both one of the first deflectors being closest to the crossover point and one of the second deflectors being closest to the crossover point so as to control both of said thus-connected deflectors.

14. A method of projecting a pattern from a reticle to a sample, comprising the steps of:

(a) irradiating the reticle with a charged-particle beam, such that the beam is patterned by the reticle;

(b) passing the patterned beam through respective first and second lenses arranged along a system axis extending from the reticle to the sample, so as to demagnify and focus the beam onto the sample at a demagnification ratio M; and (c) when the principal ray of the patterned beam is not on the system axis;

(i) at a position below the reticle, magnetically deflecting the principal ray of the patterned beam toward the system axis, (ii) at a position below a location of the step (i) deflection and above the system axis, magnetically deflecting the principal ray of the patterned beam so as to cause the principal ray to pass through a crossover point located on the system axis, (iii) at a position below the crossover point, magnetically deflecting the principal ray of the patterned beam so as to allow the principal ray to approach a desired location on the sample in a direction more parallel to the system axis, after a subsequent deflection of the principal ray, than would be possible without said subsequent deflection, (iv) at a position below a location of the deflection of step (iii) and above the sample, magnetically deflecting the principal ray of the patterned beam so as to arrive at a desired location on the sample.

15. The method of claim 14, wherein the first and second lenses are magnetic lenses each having an optical axis, and further comprising the step of, when the principal ray of the patterned beam is not on the axis, modifying the magnetic fields of the first and second lenses to shift the optical axes of the first and second lenses to coincide with the path of the principal ray of the patterned beam.

16. The method of claim 15, wherein the step of modifying the magnetic fields of the first and second lenses comprises generating a deflection magnetic field having a component perpendicular to the axis expressed by the following equation:

$$\vec{Y}(z, \vec{r}) = (½)\vec{R}(z)dB(z)/dz$$

where z is the axial coordinate, $\vec{r}$ is the radial coordinate, $\vec{Y}(z, \vec{r})$ is the field component perpendicular to the axis at the point $(z, \vec{r})$, $\vec{R}(z)$ is the radial position of the path of the principal ray at axial position z, and $dB(z)/dz$ is the first-order derivative of the unmodified magnetic field distribution on the lens axis at axial position z.

17. The method of claim 14, wherein the step of generating a deflection magnetic field comprises generating a deflection magnetic field by means of axis deflectors positioned inside the first and second lenses.

18. The method of claim 14, wherein at least one of the deflections of steps (i) and (ii) is performed using a first deflector that is connected in series with and energized by the same current source as a second deflector used to perform one of the deflections of steps (iii) and (iv).

19. The method of claim 14, wherein the step of passing the patterned beam through respective first and second lenses is performed using first and second lenses that are magnetic lenses positioned on opposite sides of the crossover point along the system axis, the crossover point dividing the distance between the reticle and the sample into respective lengths L1 and L2 such that L1/L2=M, and wherein the second lens has point symmetry with the first lens about the crossover point, but with the second lens being reduced by the demagnification ratio M in the axial dimension measured from the crossover point.

20. The method of claim 14, wherein the step of passing the patterned beam through respective first and second lenses is performed using first and second lenses that are connected in series and connected to a source of electric current such that the polarity of the first and second lenses is opposite each other.

21. The method of claim 14, wherein the deflection of step (i) is performed at a location inside the first lens, and the deflection of step (iv) is performed at a location inside the second lens.

22. A projection optical system for projecting an image of a reticle at a reticle position to a sample at a sample position, comprising:

a first lens adjacent the reticle position and having a first lens optical axis;

a second lens adjacent the sample position and having a second lens optical axis substantially aligned with the first lens optical axis;

a first beam deflector adjacent the sample position;

a second beam deflector inside the first lens;

a third beam deflector inside the second lens;

a fourth beam deflector adjacent the sample position; and axis deflectors, wherein the axis deflectors are arranged and positioned so as to selectively shift the first lens optical axis only between the first and second beam deflectors, and to deflect the second lens optical axis only between the third and fourth beam deflectors.

* * * * *

UNITED STATES PATENT AND TRADEMARK OFFICE
CERTIFICATE OF CORRECTION

PATENT NO. : 6,078,382
DATED : June 20, 2000
INVENTOR(S) : Mamoru Nakasuji

It is certified that error appears in the above-identified patent and that said Letters Patent is hereby corrected as shown below:

On the Cover Page:

Under [57] Abstract, on the penultimate line of the abstract, "def lectors" should be --deflectors--.

Column 1, line 38, "and the" should be --and (2) the--.

Column 1, line 47, "November. December." should be --Nov. Dec.--.

Column 3, line 39, "DRAWING" should be --DRAWINGS--.

In the Claims:

Column 7, line 40, claim 2, "R(z)" should be -- $\overline{R}(z)$ --.

Signed and Sealed this

Fifteenth Day of May, 2001

Attest:

NICHOLAS P. GODICI

*Attesting Officer*     Acting Director of the United States Patent and Trademark Office